US012007088B2

(12) United States Patent
Deckers (10) Patent No.: US 12,007,088 B2
(45) Date of Patent: Jun. 11, 2024

(54) LED MODULE AND VEHICLE HEADLIGHT WITH SUCH LED MODULE

(71) Applicant: LUMILEDS LLC, San Jose, CA (US)

(72) Inventor: Michael Deckers, Jülich (DE)

(73) Assignee: LUMILEDS LLC, San Jose, CA (US)

( * ) Notice: Subject to any disclaimer, the term of this patent is extended or adjusted under 35 U.S.C. 154(b) by 156 days.

(21) Appl. No.: 17/862,109

(22) Filed: Jul. 11, 2022

(65) Prior Publication Data
US 2023/0020077 A1    Jan. 19, 2023

Related U.S. Application Data

(60) Provisional application No. 63/220,154, filed on Jul. 9, 2021.

(51) Int. Cl.
| | |
|---|---|
| *H01L 33/62* | (2010.01) |
| *B60Q 1/04* | (2006.01) |
| *F21S 41/141* | (2018.01) |
| *F21S 41/153* | (2018.01) |
| *F21S 41/663* | (2018.01) |
| *H05K 1/18* | (2006.01) |

(52) U.S. Cl.
CPC .......... *F21S 41/153* (2018.01); *B60Q 1/0408* (2013.01); *F21S 41/663* (2018.01); *H05K 1/181* (2013.01)

(58) Field of Classification Search
CPC ...... F21S 41/141; F21S 41/153; F21S 41/663; H01L 23/5384; H01L 25/0753; H01L 33/62; H05B 45/44; H05B 45/48; H05B 45/52; H05B 45/54; B60Q 1/0408
See application file for complete search history.

(56) References Cited

U.S. PATENT DOCUMENTS

| | | | |
|---|---|---|---|
| 8,314,558 B2 * | 11/2012 | Dassanayake | ........ F21S 41/663 315/82 |
| 9,246,403 B2 | 1/2016 | Siessegger et al. | |
| 9,980,341 B2 * | 5/2018 | Bower | ........ H05B 45/20 |

(Continued)

FOREIGN PATENT DOCUMENTS

| | | |
|---|---|---|
| EP | 2560219 | 2/2013 |
| WO | 2020/099143 | 5/2020 |

OTHER PUBLICATIONS

International Search Report and Written Opinion dated Oct. 13, 2022 for PCT International Application No. PCT/US2022/036709.

*Primary Examiner* — Tung X Le
(74) *Attorney, Agent, or Firm* — Volpe Koenig (57) ABSTRACT

A composite array has two two-dimensional arrays on a substrate each having two rows of LEDs. The LEDs in each array have the same orientation as all other LEDs in that array. First electrical traces sequentially couple LEDs in the first string and the second string by beginning at opposite corners of the composite array and alternating between rows of each of the first and second arrays. A second electrical trace couples ends of the first and second strings across rows of the composite array. Third electrical traces route outside the composite array and are coupled, respectively, to a beginning of the first string for the row of the composite array containing the beginning of the first string, a beginning of the second string for the other row, the end of the first LED string for the other row, and electrodes of LEDs in the other row.

20 Claims, 8 Drawing Sheets

(56) References Cited

U.S. PATENT DOCUMENTS

| | | |
|---|---|---|
| 11,424,223 B2 | 8/2022 | Deckers |
| 2011/0062482 A1* | 3/2011 | Solomensky ....... H01L 25/0753 |
| | | 257/E33.066 |
| 2011/0180817 A1 | 7/2011 | Ishizaki et al. |
| 2015/0267906 A1* | 9/2015 | Wilcox ................... H01L 33/62 |
| | | 362/382 |
| 2017/0309801 A1* | 10/2017 | Kawai ................... H01L 33/507 |
| 2020/0152613 A1 | 5/2020 | Deckers |

* cited by examiner

LED MODULE AND VEHICLE HEADLIGHT WITH SUCH LED MODULE

CROSS REFERENCE TO RELATED APPLICATIONS

This application claims the benefit of U.S. Provisional Patent Application No. 63/220,154, which was filed on Jul. 9, 2021, the contents of which are hereby incorporated by reference herein. This application is related to U.S. patent application Ser. No. 16/681,144, which was filed on Nov. 12, 2019, the contents of which are incorporated herein by reference.

BACKGROUND

Light emitting diodes (LEDs), which may encompass all semiconductor light emitting devices including, for example, diode lasers, and not differentiating between LED dies and packaged LEDs, more and more replace older technology light sources due to superior technical properties, such as energy efficiency and lifetime. This may also be true or demanding applications, for example in terms of luminance, luminosity, and/or beam shaping, such as vehicle headlighting. Particularly interesting are LEDs spatially arranged in two-dimensional arrays. Partial or full single addressability of the LEDs in such an array may allow advanced applications in all lighting fields, such as in general illumination, flash, and, in particular, in vehicular headlighting, such as advanced driving beam (ADB).

SUMMARY

A composite array has two two-dimensional arrays on a substrate each having two rows of LEDs. The LEDs in each array have the same orientation as all other LEDs in that array. First electrical traces sequentially couple LEDs in the first string and the second string by beginning at opposite corners of the composite array and alternating between rows of each of the first and second arrays. A second electrical trace couples ends of the first and second strings across rows of the composite array. Third electrical traces route outside the composite array and are coupled, respectively, to a beginning of the first string for the row of the composite array containing the beginning of the first string, a beginning of the second string for the other row, the end of the first LED string for the other row, and electrodes of LEDs in the other row.

BRIEF DESCRIPTION OF THE DRAWINGS

A more detailed understanding can be had from the following description, given by way of example in conjunction with the accompanying drawings wherein.

A more detailed understanding can be had from the following description, given by way of example in conjunction with the accompanying drawings wherein.

DETAILED DESCRIPTION

Examples of different light illumination systems and/or light emitting diode ("LED") implementations will be described more fully hereinafter with reference to the accompanying drawings. These examples are not mutually exclusive, and features found in one example may be combined with features found in one or more other examples to achieve additional implementations. Accordingly, it will be understood that the examples shown in the accompanying drawings are provided for illustrative purposes only and they are not intended to limit the disclosure in any way. Like numbers refer to like elements throughout.

It will be understood that, although the terms first, second, third, etc. may be used herein to describe various elements, these elements should not be limited by these terms. These terms may be used to distinguish one element from another. For example, a first element may be termed a second element and a second element may be termed a first element without departing from the scope of the present invention. As used herein, the term "and/or" may include any and all combinations of one or more of the associated listed items.

It will be understood that when an element such as a layer, region, or substrate is referred to as being "on" or extending "onto" another element, it may be directly on or extend directly onto the other element or intervening elements may also be present. In contrast, when an element is referred to as being "directly on" or extending "directly onto" another element, there may be no intervening elements present. It will also be understood that when an element is referred to as being "connected" or "coupled" to another element, it may be directly connected or coupled to the other element and/or connected or coupled to the other element via one or more intervening elements. In contrast, when an element is referred to as being "directly connected" or "directly coupled" to another element, there are no intervening elements present between the element and the other element. It will be understood that these terms are intended to encompass different orientations of the element in addition to any orientation depicted in the figures.

Relative terms such as "below," "above," "upper,", "lower," "horizontal" or "vertical" may be used herein to describe a relationship of one element, layer, or region to another element, layer, or region as illustrated in the figures. It will be understood that these terms are intended to encompass different orientations of the device in addition to the orientation depicted in the figures.

With current LED technology, for high luminosity applications, such as in vehicle headlighting, the luminous power of a single LED may not be sufficient. Thus, multiple LEDs may be required, which may be arranged in a single or multiple row 2-dimensional rectangular array pattern. Connecting the electrodes of the LEDs to controlled switches may allow varying the brightness of the connected LEDs or even shortcutting them completely. This may enable versatile beam control in a vehicle headlight, which may be referred to as ADB while light emitted from the LED light source may be referred to as matrix light. Traditionally, in such matrices, the LEDs are relatively far spaced apart from each other. Such may be unavoidable for discrete LEDs. However, for wafer level package (WLP) and sometimes also referred to as Chip Scale Packaging (CSP), the separation distance may still be relatively large, such as when the LEDs are surrounded by light blocking (e.g., diffusively white scattering) walls to avoid cross-talk between the LEDs.

Large separation distances may, unavoidably, lead to unlit areas between neighboring LEDs which, when directly imaged onto the road, would lead to a quite non-uniform illumination with alternating dark and bright spots in a chess-board pattern. Thus, traditionally, such wide spaced matrices may use primary optics (e.g., finger-like collimation matrices, lens arrays, or integrated rows of cylinder lenses) to map the LED array to a uniformly luminating exit area of the primary optics, which may then be imaged by secondary optics (in the simplest case, by a projection lens) onto the road. Primary optics, not surprisingly, may increase system complexity and cost.

There is considerable effort to develop so-called µ-LED arrays where, in the end, tens or even hundreds of thousands of closely spaced LEDs may be monolithically integrated together with their control circuitry to a more or less uniformly luminating light source, which can be directly imaged to the area to be illuminated. Such single addressable µ-LED arrays may not just yield powerful displays but also most advanced vehicle headlights. However, this technology is not yet available in the market and may also remain relatively expensive for many years to come.

In the meantime, LED arrays with relatively close spaced LEDs, such as neighboring LED distances in the range of 200 µm down to 50 µm or even 25 or 10 µm, have already entered the market. Such close interspacing, among other things, was made possible by using especially thin surrounding walls for the LEDs together with the WLP technology. With appropriately designed projection optics, the still existent dark spaces between the LEDs can, for example, be smeared by scattering elements (e.g., micro-prism arrays on the lens entry surface of the secondary optics) or homogenized by wavy surface shapes. Thus, these LED arrays may not require primary optics but can be directly imaged into the space to be illuminated.

Such densely packed LED arrays, which may be termed mini-LED arrays, however, unlike µ-LED arrays, may not be monolithically integrated devices but are still LEDs mounted on a substrate. Thus, on the one hand, they need their circuitry supplied by the substrate, and they may need the substrate as a heat spreader or heat sink to keep the LEDs' junction temperature low. Both such tasks, circuitry routing as well as thermal management, may become increasingly difficult with smaller separation distances between the LEDs.

Figure 1:
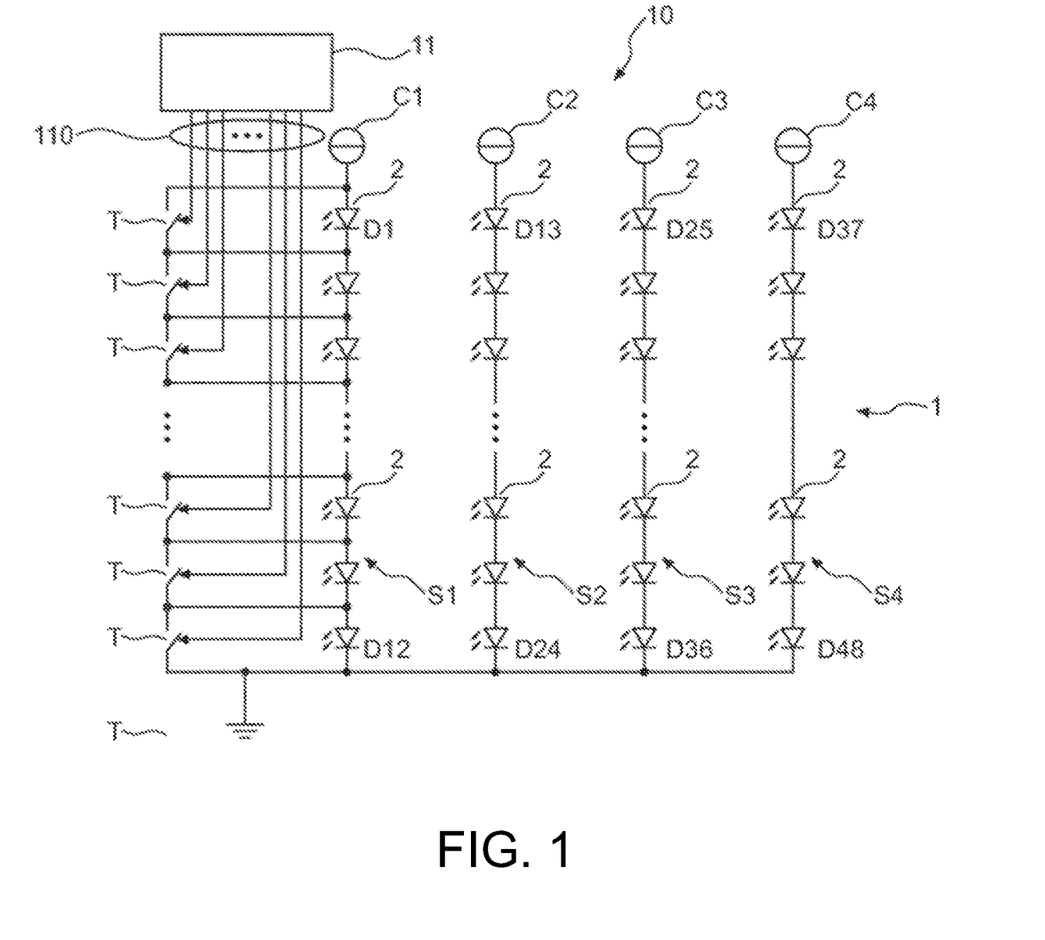
FIG. 1 is a schematic diagram of an example circuit of an LED lighting arrangement.

FIG. 1 is a schematic diagram of an example circuit of an LED lighting arrangement 10. In the example illustrated in FIG. 1, the example circuit includes a controller 11 communicatively coupled via a control interface 110 to switches T, which may serve as shortcuts and which are, in the illustrated example, electrically coupled in parallel to LEDs 2 of LED an array 1. The LEDs 2 are also labeled as D1 to D48 in FIG. 1. The LEDs 2 may be arranged in four sequentially connected LED strings S1 to S4, forming the parallel columns of LED array 1, which may be powered by current sources C1 to C4. The series connection of LEDs in a string may typically be used for LED currents above 200 mA where, for driver electronics, string lengths between 12 and 20 LEDs may be usual but may also vary between 3 and 30 LEDs. If more LEDs are needed further strings may be added in parallel as shown in FIG. 1. The switches T (only shown in FIG. 1 for the LED string S1), with each switch parallel to a particular LED 2, may allow the controller 11 to individually address all LEDs D1 to D48 of the LED array 1 to switch on and off each LED independent from the switching state of the other LEDs.

Figure 2:
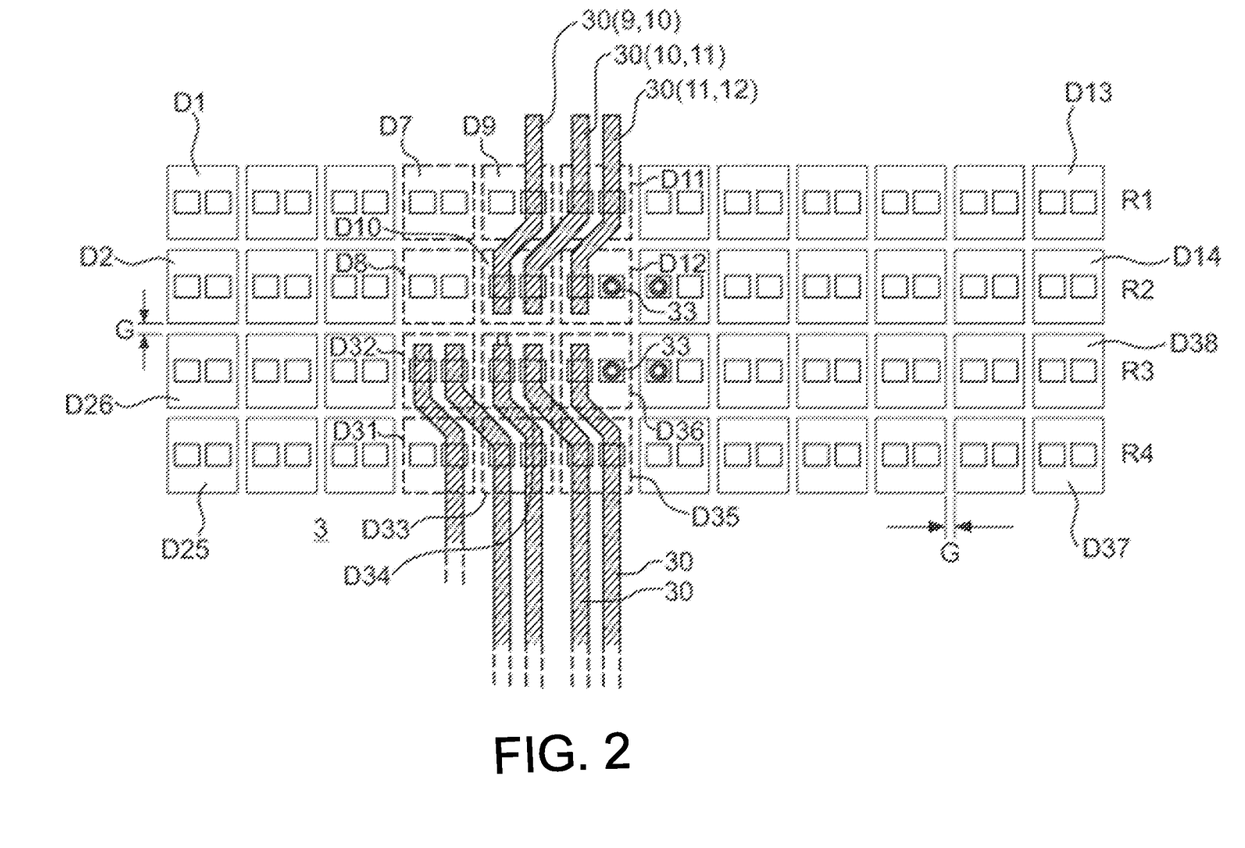
FIG. 2 is a schematic diagram of the spatial arrangement of LEDs in FIG. 1 with an example electrical connectivity of the LEDs shown.

FIG. 2 is a schematic diagram of the spatial arrangement of LEDs in FIG. 1 with an example electrical connectivity of the LEDs shown. In the example illustrated in FIG. 2, the LED strings S1 to S4 are arranged on a PCB 3, with each string occupying two rows in an alternating fashion in the four quarters of a four row (R1 to R4) rectangle with the beginnings D1, D13, D25, D37 of the LED strings being located in the four corners of the rectangle and the ends D12, D24, D36, D48 of the LED strings in the center of the rectangle. Electrical traces (or tracks) 30, 30(x,y) may electrically couple the cathode of LED Dx to the anode of LED Dy to create outside connectivity to the power supplies C1 to C4 and ground and the bypassing switches T for the electrodes of all LEDs 2. For that, the electrodes of LEDs 2 may be, for example, soldered in a flip-chip manner onto solder pads of PCB 3 connected to traces 30. The zigzag pattern of traces 30 may occupy little if any extra space between LEDs 2, thus allowing very small gaps G between the light emitting areas of LEDs 2.

As mentioned above, in such an arrangement, the ends of the four LED strings necessarily are in the center of LED array 1 and thus, cannot be contacted from outside the rectangle on the same circuit layer as the electrical traces 30. Therefore, to contact the ends D12, D24, D36, D48 of the LED strings (to ground), these ends may instead be contacted through micro-vias 33 to a second circuit layer of PCB 3, which may be the metal core (MC) of an insulated metal substrate (IMS) or an MC of PCB 3. The need for two circuit levels, however, may increase system complexity. Moreover, each of the layers must be electrically insulated from one another, and electrically insulating layers have relatively bad thermal properties (e.g., have relatively low thermal conductivity). In particular, for densely packed LED arrays of high luminosity and, thus, high electrical power and considerable waste heat, thermal management may become challenging.

From a point of view of thermal management, ceramic substrates, such as substrates made of AlN (aluminum nitride), may offer high thermal conductivity and, thus, may have desirable heatsinking properties. However, with a metallization layer on the mounting surface of a ceramic substrate, only a single circuit layer may be used. Adding further circuit layers to a ceramic substrate, connected, for example, by micro-vias, may considerably add to manufacturing complexity and, thus, cost. Addressing the issue of requiring more than a single circuit layer, the embodiments described herein are directed toward a new arrangement of the LED strings.

Figure 3:
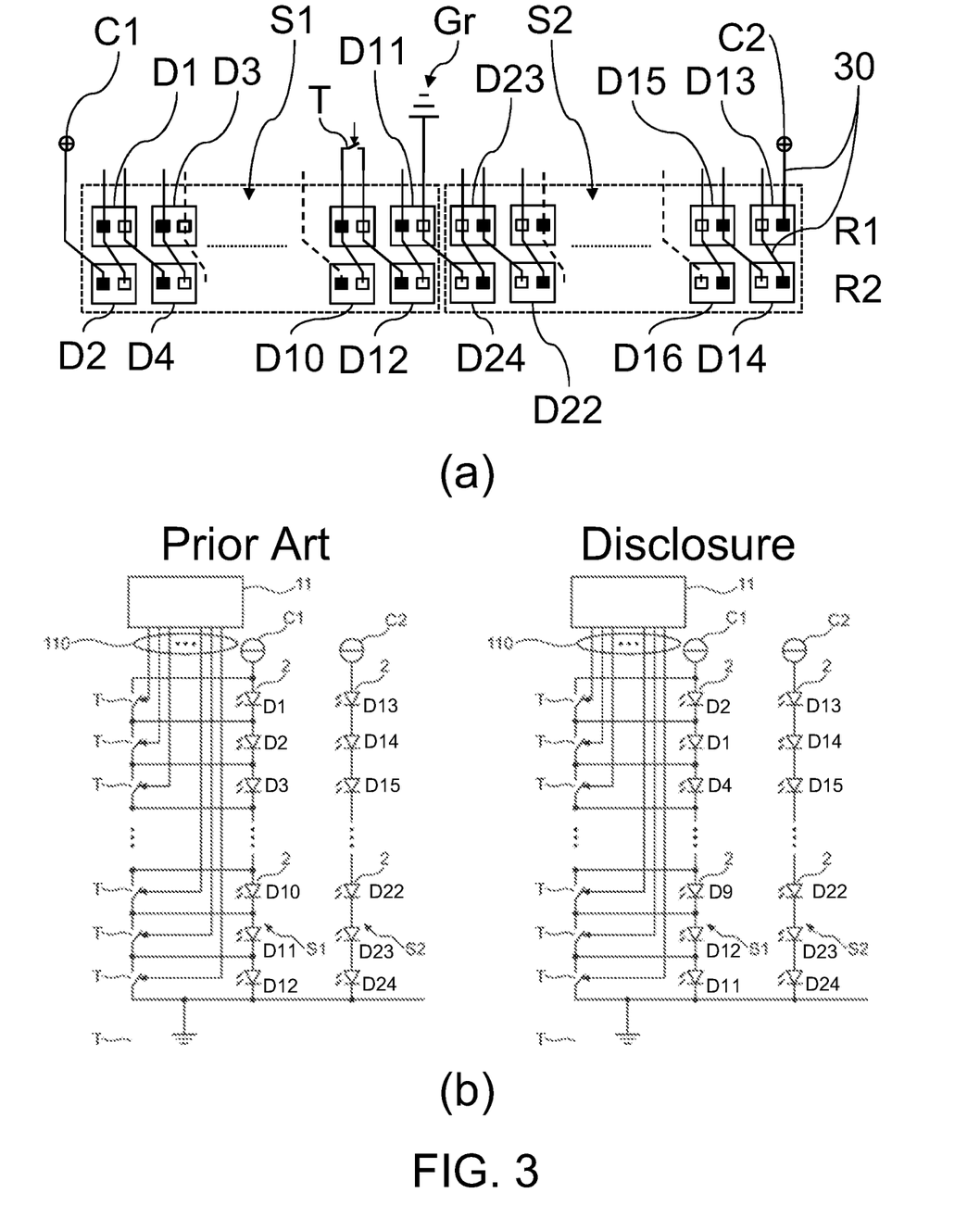
FIG. 3 is a schematic diagram of an example LED module in partial comparison to the LED lighting arrangement of FIG. 1.

FIG. 3 is a schematic diagram of an example LED module in partial comparison to the LED lighting arrangement of FIG. 1. The upper part (a) of FIG. 3 shows the spatial arrangement and connectivity in the manner shown in FIG. 2, and the lower part (b) of FIG. 3 shows the arrangement and connectivity in a manner similar to FIG. 1 and in comparison to the relevant part of FIG. 1).

Similar to FIGS. 1 and 2, in the example illustrated in FIG. 3, the LEDs D1 to D12 of a first LED string S1 and the LEDs D13 to D24 of a second LED string S2 are arranged respectively on two rows of a first and a second two-dimensional array. These arrays may be placed horizontally beside each other, forming a composite two-dimensional array with two rows R1, R2. In the LED strings S1, S2, first ones of the electrical traces 30 may electrically couple the cathode (shown in FIG. 3 as empty rectangles) of a preceding LED with the anode (shown in FIG. 3 as filled rectangles) of the following LED. Further, similar to FIGS. 1 and 2, the LEDs in the left LED string S1 may all be oriented with their anode on the left (when oriented as shown in FIG. 3) and their cathode right (when oriented as shown in FIG. 3), while the LEDs in the right LED string S2 are oppositely oriented (or mirrored) in FIG. 3 with their anode on the right (when oriented as shown in FIG. 3) and their cathode on the left (when oriented as shown in FIG. 3). Finally, similar to FIGS. 1 and 2, in FIG. 3, the beginning D13 of the right LED string S2 is in the upper right corner of the composite array and its end D24 is in the middle of the composite array (in the lower row R2). Some third ones of the electrical traces 30 may electrically couple all the electrodes of the LEDs in the upper row R1 to the outside of the composite array (allowing to connect shortcutting parallel switches T, only one of which is exemplarily shown in FIG. 3, supplying the anode of the beginning LED D13 of the right LED string S2 with power from current source C2).

However, unlike the circuits illustrated in FIGS. 1 and 2, in FIG. 3, the beginning of the left LED string S1 is located in the lower left corner of the composite array or in other words is not, as in FIG. 1, the LED D1 of the upper left corner, but instead may be the LED D2 of the lower left corner diagonally opposite to the beginning D13 of the right LED string S2 in the upper right corner of the composite array. A further third one of the electrical traces 30, not shown in FIG. 1 or FIG. 2, may supply the anode of such beginning LED D2 of the left LED string S1 with power from current source C1.

Placing the beginning of the left LED string S1 into the lower row R2, by the alternating pattern of the connecting first ones of the electrical traces 30 (alternating between the lower and upper rows R1, R2), lets the left LED string S1 end in the upper right LED D11 of the first array in the upper row R1. Thus, by the one of the third ones of the electrical traces 30 emanating from the upper row R1, such string end (e.g., the cathode of LED D11) may be routed out of the composite array and can be connected to electrical ground Gr. By the second one of the electrical traces 30 connecting the ends of the left and right LED strings 51, S2 (e.g., connecting the cathodes of LEDs D11 and D24), the one of the third ones of the electrical traces 30 grounding the left LED string S1 may also ground the right LED string S2.

The lower part (b) of FIG. 3 compares the circuit diagram corresponding to the arrangement of LEDs 2 and electrical traces 30 in the upper part (a) to the corresponding part of the circuit diagram of FIG. 1. In the comparison in the lower part (b), the difference in the sequence of LEDs in the first LED string S1 can be seen.

By such rearrangement of the series connection of the left LED string S1 and by adding the outside connection of its beginning, i.e., of the anode of the lower left LED D2 to the current source C1, the ground connection of both LED strings S1, S2 may be obtained by the second one of the electrical traces 30 connecting the cathodes of LEDs D11 and D24 and the one of the third ones of the electrical traces 30 to electrical ground Gr on the same circuit level than all the other (first ones and third ones of the) electrical traces 30. Accordingly, all necessary electrical connections can be provided on a single circuit level, thus, also enabling the use of electrically insulating as, for example, ceramic substrates with a single metallization layer only.

While present disclosure might also be used with an IMS, or also with a standard PCB, it enables straightforward use of ceramic substrates, such as made of AlN. Such AlN substrate with a single metallization layer on its mounting surface for forming the electrical traces 30 may be sized itself as a heatsink or may be designed as a heat spreader to an even better performing heatsink for thermal management of the LED module. The LEDs may be placed on the mounting surface, such as by soldering to solder pads on the mounting surface connecting the electrical traces, in WLP technology, such as by using flip-chip LEDs.

For enabling single addressability of the LEDs, the switches T may be added to the third ones of the electrical traces routed out from the electrodes of the LEDs of the upper row R1, with each switch T parallel to a particular LED 2 in either of the two rows R1, R2. The switches may be placed on an external PCB or may be mounted to the substrate of the LED module itself. Also, the controller 11 shown in FIG. 1 may be external or mounted on the LED module's substrate to achieve a high degree of integration. In such highly integrated case, such as with the switches T and the controller 11 mounted on the substrate, the controller 11 may be connected by fourth ones of the electrical traces 30, on the same circuit level as the other ones of the electrical traces 30, to control ports of the switches T, as compared to FIG. 1. Furthermore, a connector may be mounted to the substrate for external power supply and control of the LED module. For power supply, the connector may connect via the corresponding ones of the third ones of the electrical traces to the beginnings and ends of the two LED strings, and for LED switching, the connector may connect via fifth ones of the electrical traces 30 to the controller. Such fifth ones of the electrical traces 30 may be just two lines using codes for selecting the desired operation patterns of the LEDs.

As a further option, an optical component like a reflector or lens might be mounted to the substrate to process the light emitted from the LEDs in operation.

While FIG. 3 shows the third ones of the electrical traces 30 routing out from the composite array all electrodes of the LEDs of the upper row R1, such electrical traces may only be needed if full single addressability of all LEDs D1, . . . , D24 is desired. For only partial single addressability (i.e., if only some of the LEDs shall be singly controllable or if groups of LEDs shall be controllable as a group only), some of the third ones of the electrical traces emanating from the electrodes of the LEDs of the upper row R1 can be omitted. In other words, it may be sufficient for this disclosure if the third ones of the electrical traces 30 route out of the composite array, for the lower row R2, the anode of the beginning LED D2 of the first LED string S1, and, for the upper row R1, besides the cathode of the ending LED D11 of the first LED string S1 and the anode of the beginning LED D13 of the second LED string S2, only some of the further electrodes of the LEDs in the upper row R1.

Additionally, besides a full shortcutting of an LED or an LED group by a parallel switch T, the LED module may foresee a parallel varistor instead of a parallel switch T. The controller may then select the resistance of the varistor to control the current bypassing the LED or LED group and, thus, the current flowing through the LEDs or LED group and, by that, their remaining brightness. This may allow a much more fine grained control of the beam pattern generated by the LED module.

The LED strings may serially connect any number of LEDs. However, 12 to 20 LEDs may be particularly advantageous which may also be expanded to 3 to 30 LEDs.

Especially with ceramic substrates, very small distances between neighboring LEDs in the composite array may be enabled, for example distances below 100 μm down to 50, 25, or 10 μm, or even below that.

With the two strings of the embodiment illustrated in FIG. 3, and with 12 to 20 LEDs per string, a rectangular composite array of 24 to 40 LEDs in two rows may be enabled. By mirroring the arrangement of FIG. 3 at a horizontal axis H (similar to the example illustrated in FIG. 2), the number of LEDs may be doubled to 48 to 80 LEDs in 4 rows.

Figure 4:
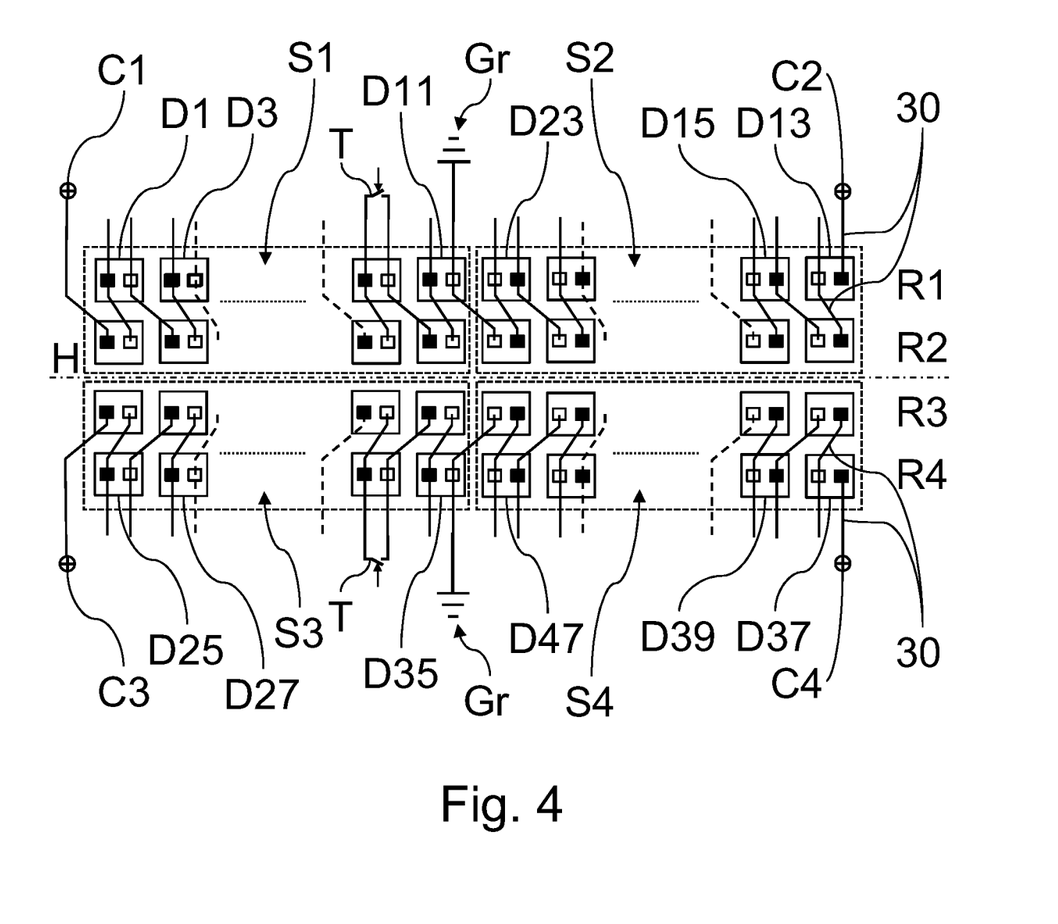
FIG. 4 is a schematic diagram of another example LED module.

FIG. 4 is a schematic diagram of another example LED module. In the example illustrated in FIG. 4, an LED module with 48 LEDs D1 through D48. As can be seen in FIG. 4, traces 30 may be used to electrically couple the anodes of LEDs D2, D13, D24 and D30 are electrically coupled to current sources C1, C2, C3 and C4, respectively, and the cathodes of LEDs D11 and D46 are directly connected to ground (Gr).

In the example illustrated in FIG. 4, mirroring, as in FIG. 3, is about the vertical axis V. However, mirroring about the horizontal axis H, either instead of or in addition to mirroring about the vertical axis V, may also be possible. With just a mirroring at the vertical axis V, a 2 row matrix of 48 to 80 LEDs results (an example of which is illustrated in FIG. 4). With mirroring at both axes H and V, a 4 row array of 96 to 160 LEDs may be realized.

Figure 5:
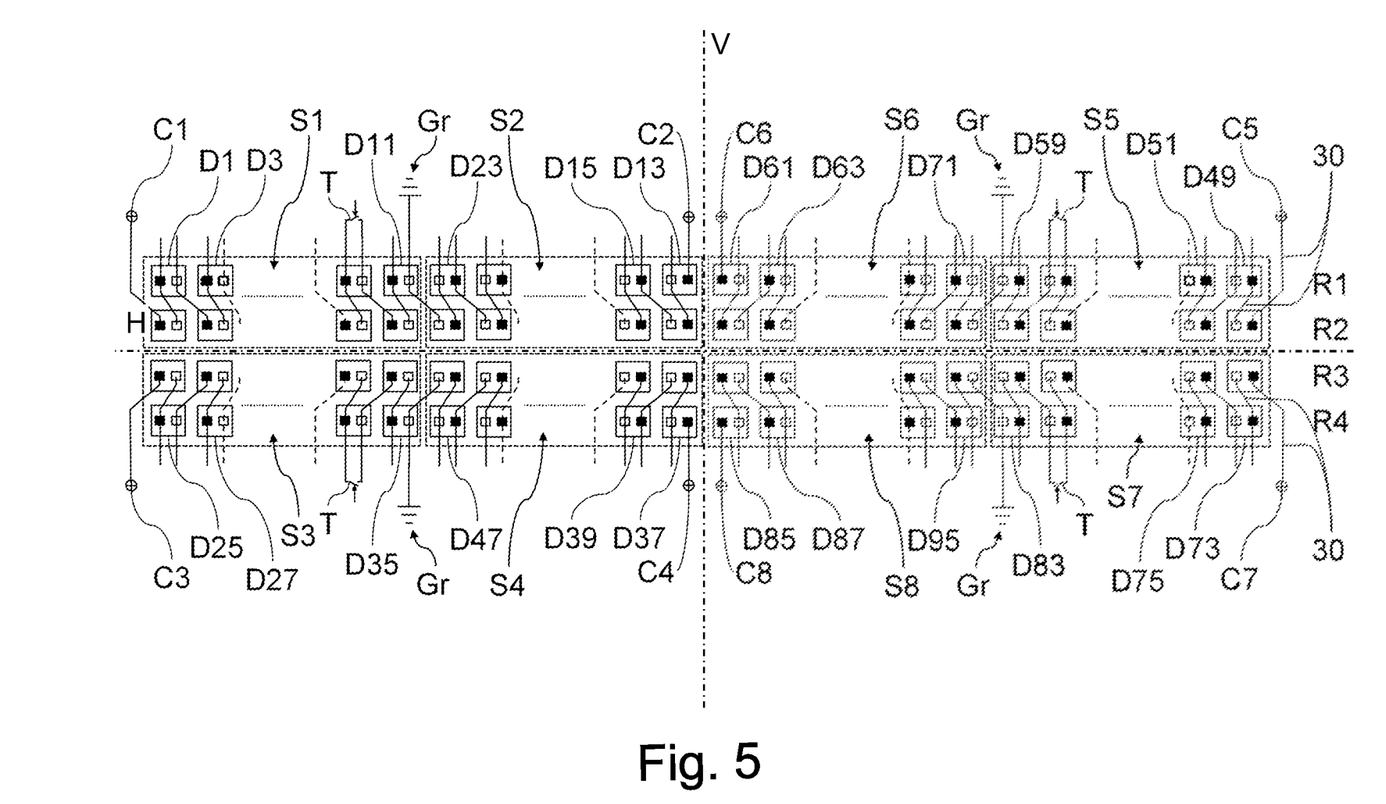
FIG. 5 is a schematic diagram of still another example LED module.

FIG. 5 is a schematic diagram of still another example LED module. As shown in FIG. 5, the LED module includes 96 LEDs D1 to D96 (in eight LED strings S1 to S8 powered by 8 current sources C1 to C8). In the example illustrated in FIG. 5, all of these arrangements are contacted with electrical traces 30 in a single circuit layer only, thus, for example, allowing the use of a ceramic AlN substrate with a single metallization layer on its mounting surface.

An LED module, such as described above, may have many uses, such as in in camera flashes, general illumination, and in vehicle headlighting where it might be advantageous e.g. in ADBs.

Figure 6:
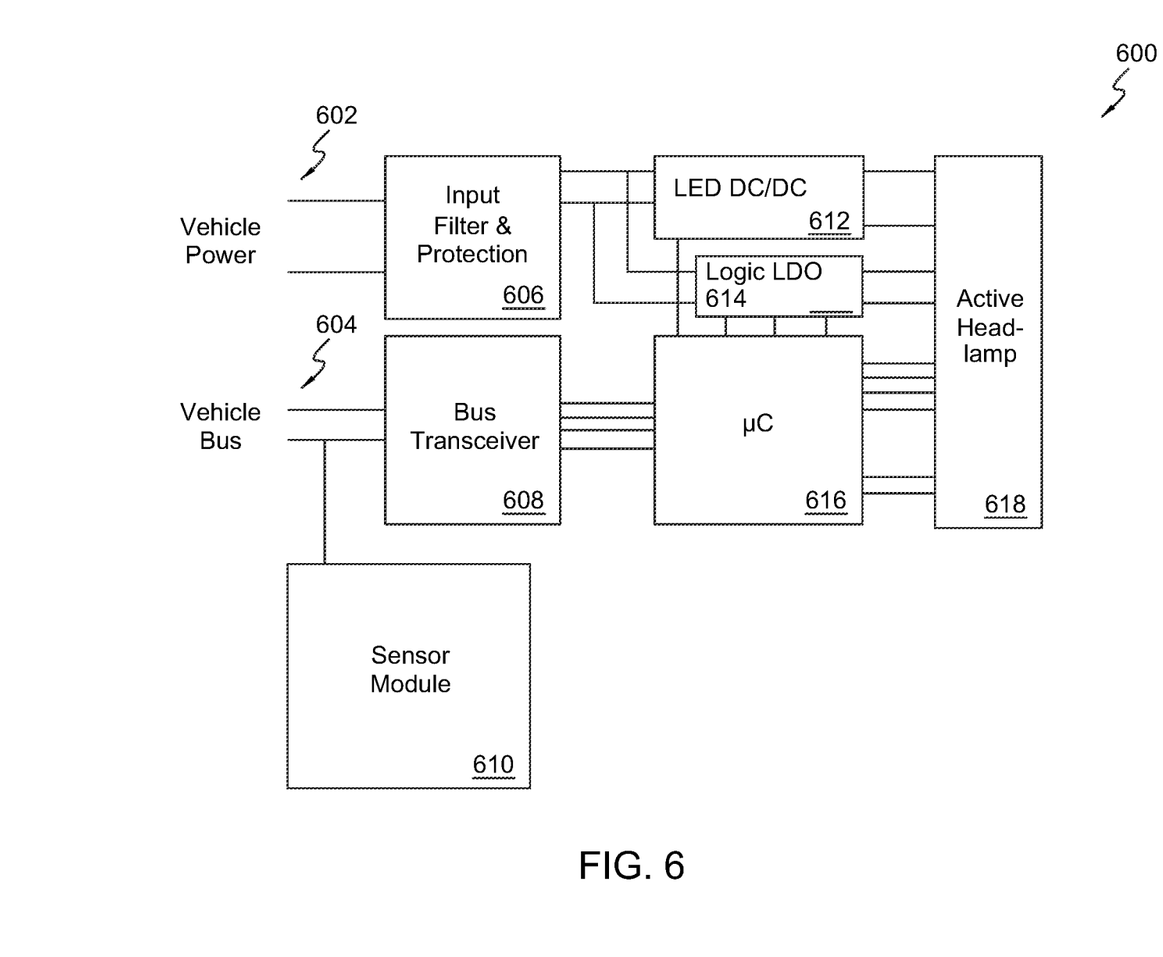
FIG. 6 is a diagram of an example vehicle headlamp system.

FIG. 6 is a diagram of an example vehicle headlamp system 600 that may incorporate one or more of the embodiments and examples described herein. The example vehicle headlamp system 600 illustrated in FIG. 6 includes power lines 602, a data bus 604, an input filter and protection module 606, a bus transceiver 608, a sensor module 610, an LED direct current to direct current (DC/DC) module 612, a logic low-dropout (LDO) module 614, a micro-controller 616 and an active head lamp 618.

The power lines 602 may have inputs that receive power from a vehicle, and the data bus 604 may have inputs/outputs over which data may be exchanged between the vehicle and the vehicle headlamp system 600. For example, the vehicle headlamp system 600 may receive instructions from other locations in the vehicle, such as instructions to turn on turn signaling or turn on headlamps, and may send feedback to other locations in the vehicle if desired. The sensor module 610 may be communicatively coupled to the data bus 604 and may provide additional data to the vehicle headlamp system 600 or other locations in the vehicle related to, for example, environmental conditions (e.g., time of day, rain, fog, or ambient light levels), vehicle state (e.g., parked, in-motion, speed of motion, or direction of motion), and presence/position of other objects (e.g., vehicles or pedestrians). A headlamp controller that is separate from any vehicle controller communicatively coupled to the vehicle data bus may also be included in the vehicle headlamp system 600. In FIG. 6, the headlamp controller may be a micro-controller, such as micro-controller (μc) 616. The micro-controller 616 may be communicatively coupled to the data bus 604.

The input filter and protection module 606 may be electrically coupled to the power lines 602 and may, for example, support various filters to reduce conducted emissions and provide power immunity. Additionally, the input filter and protection module 606 may provide electrostatic discharge (ESD) protection, load-dump protection, alternator field decay protection, and/or reverse polarity protection.

The LED DC/DC module 612 may be coupled between the input filter and protection module 606 and the active headlamp 618 to receive filtered power and provide a drive current to power LEDs in the LED array in the active headlamp 618. The LED DC/DC module 612 may have an input voltage between 7 and 18 volts with a nominal voltage of approximately 13.2 volts and an output voltage that may be slightly higher (e.g., 0.3 volts) than a maximum voltage for the LED array (e.g., as determined by factor or local calibration and operating condition adjustments due to load, temperature or other factors).

The logic LDO module 614 may be coupled to the input filter and protection module 606 to receive the filtered power. The logic LDO module 714 may also be coupled to the micro-controller 616 and the active headlamp 618 to provide power to the micro-controller 616 and/or electronics in the active headlamp 618, such as CMOS logic.

The bus transceiver 608 may have, for example, a universal asynchronous receiver transmitter (UART) or serial peripheral interface (SPI) interface and may be coupled to the micro-controller 616. The micro-controller 616 may translate vehicle input based on, or including, data from the sensor module 610. The translated vehicle input may include a video signal that is transferrable to an image buffer in the active headlamp 618. In addition, the micro-controller 616 may load default image frames and test for open/short pixels during startup. In embodiments, an SPI interface may load an image buffer in CMOS. Image frames may be full frame, differential or partial frames. Other features of micro-controller 616 may include control interface monitoring of CMOS status, including die temperature, as well as logic LDO output. In embodiments, LED DC/DC output may be dynamically controlled to minimize headroom. In addition to providing image frame data, other headlamp functions, such as complementary use in conjunction with side marker or turn signal lights, and/or activation of daytime running lights, may also be controlled.

Figure 7:
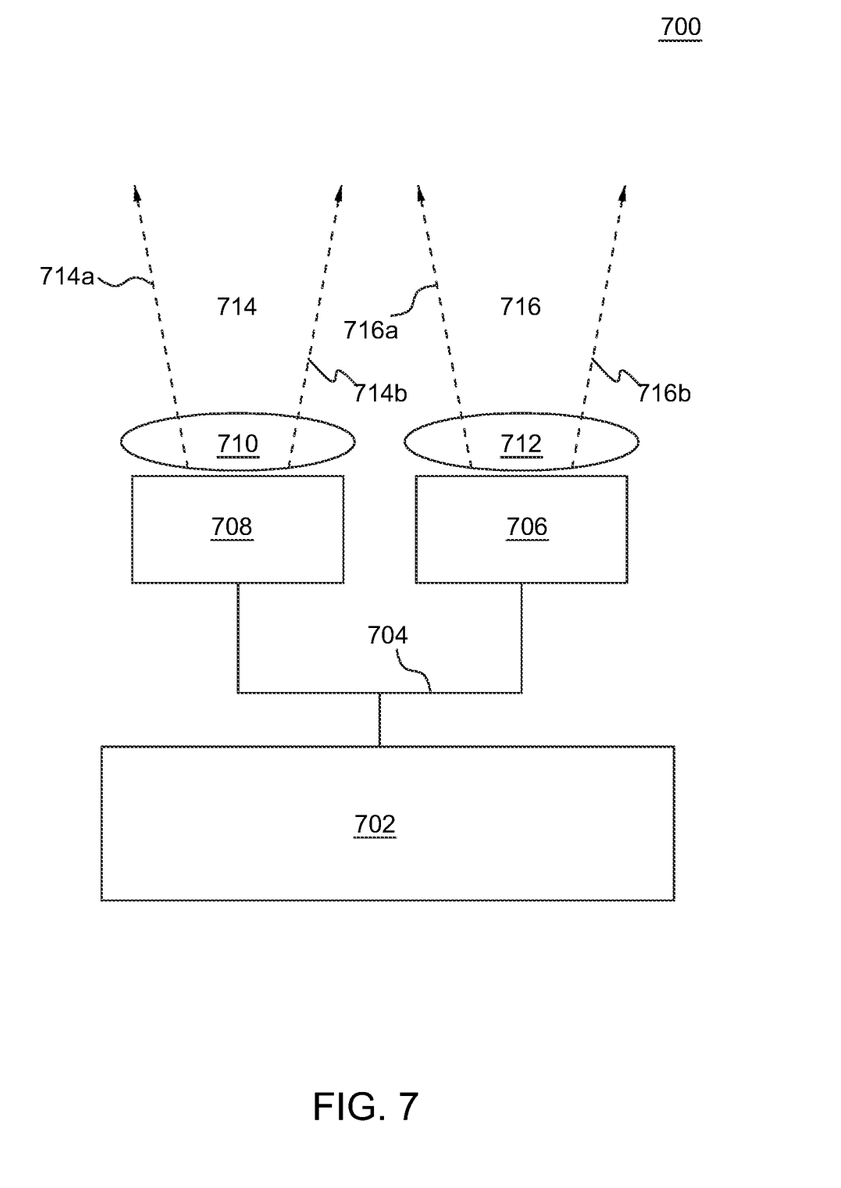
FIG. 7 is a diagram of another example vehicle headlamp system.

FIG. 7 is a diagram of another example vehicle headlamp system 700. The example vehicle headlamp system 700 illustrated in FIG. 7 includes an application platform 702, two LED lighting systems 706 and 708, and secondary optics 710 and 712.

The LED lighting system 708 may emit light beams 714 (shown between arrows 714a and 714b in FIG. 7). The LED lighting system 706 may emit light beams 716 (shown between arrows 716a and 716b in FIG. 7). In the embodiment shown in FIG. 7, a secondary optic 710 is adjacent the LED lighting system 708, and the light emitted from the LED lighting system 708 passes through the secondary optic 710. Similarly, a secondary optic 712 is adjacent the LED lighting system 706, and the light emitted from the LED lighting system 706 passes through the secondary optic 712. In alternative embodiments, no secondary optics 710/712 are provided in the vehicle headlamp system.

Where included, the secondary optics 710/712 may be or include one or more light guides. The one or more light guides may be edge lit or may have an interior opening that defines an interior edge of the light guide. LED lighting systems 708 and 706 may be inserted in the interior openings of the one or more light guides such that they inject light into the interior edge (interior opening light guide) or exterior edge (edge lit light guide) of the one or more light guides. In embodiments, the one or more light guides may shape the light emitted by the LED lighting systems 708 and 706 in a desired manner, such as, for example, with a gradient, a chamfered distribution, a narrow distribution, a wide distribution, or an angular distribution.

The application platform 702 may provide power and/or data to the LED lighting systems 706 and/or 708 via lines 704, which may include one or more or a portion of the power lines 602 and the data bus 604 of FIG. 6. One or more sensors (which may be the sensors in the vehicle headlamp system 700 or other additional sensors) may be internal or external to the housing of the application platform 702. Alternatively, or in addition, as shown in the example vehicle headlamp system 600 of FIG. 6, each LED lighting system 708 and 706 may include its own sensor module, connectivity and control module, power module, and/or LED array.

In embodiments, the vehicle headlamp system 700 may represent an automobile with steerable light beams where LEDs may be selectively activated to provide steerable light. For example, an array of LEDs or emitters may be used to define or project a shape or pattern or illuminate only selected sections of a roadway. In an example embodiment, infrared cameras or detector pixels within LED lighting systems 706 and 708 may be sensors (e.g., similar to sensors in the sensor module 610 of FIG. 6) that identify portions of a scene (e.g., roadway or pedestrian crossing) that require illumination.

Figure 8:
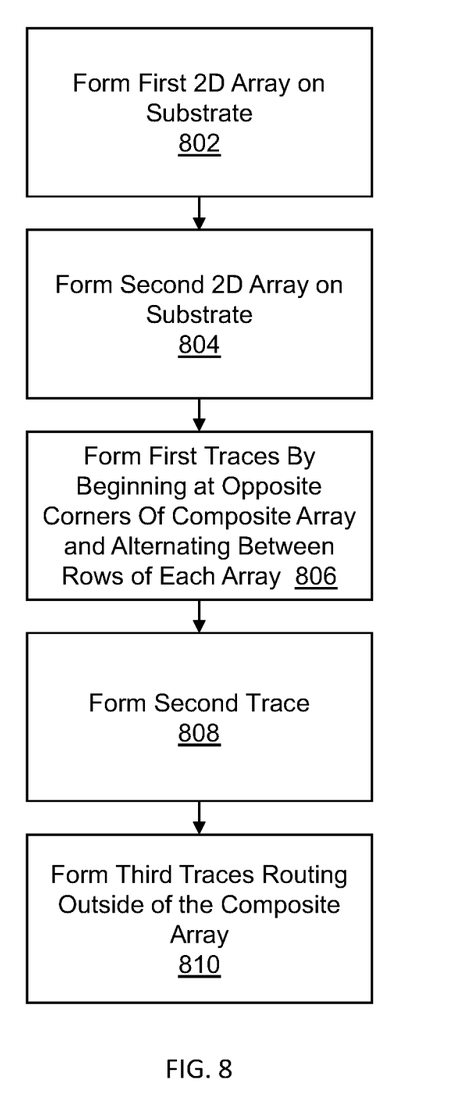
FIG. 8 is a flow diagram of an example method of manufacturing an LED module.

FIG. 8 is a flow diagram of a method of manufacturing an LED module. A first 2D array (802) and a second 2D array (804) may be formed on a substrate. The two arrays may form a two row composite two-dimensional array on a mounting surface of a substrate. The LEDs of each array may all have a same first orientation. The first and second arrays may be adjacent one another and may each have two rows of LEDs. First electrical traces may be formed on a mounting surface of the substrate (806). They may be formed in locations such that the first electrical traces sequentially electrically couple LEDs of the first array and LEDs of the second array to form a first LED string and a second LED string by beginning at opposite corners of the first two-row composite two-dimensional array and alternating between the two rows of each of the first and second two-dimensional arrays, each of the first and second LED strings having a beginning and an end.

A second electrical trace may be formed on the mounting surface of the substrate (808). The second electrical trace may be formed in a location such that the second electrical trace is electrically coupled between the end of the first LED string and the end of the second LED string across the two rows of the two-row composite two-dimensional array. Third electrical traces may be formed on the mounting surface and route outside of the first two row composite two-dimensional array (810). This may be done such that: a first one of the plurality of third electrical traces is electrically coupled to the beginning of the first LED string for the row of the first two row composite two-dimensional array containing the beginning of the first LED string, a second one of the plurality of third electrical traces is electrically coupled to the beginning of the second LED string for the other row of the two row composite two-dimensional array, a third one of the plurality of third electrical traces is electrically coupled to the end of the first LED string for the other row of the two row composite two-dimensional array, and at least one fourth one of the plurality of third electrical traces is electrically coupled to at least some of the further electrodes of the LEDs in the other row.

Having described the embodiments in detail, those skilled in the art will appreciate that, given the present description, modifications may be made to the embodiments described herein without departing from the spirit of the inventive concept. Therefore, it is not intended that the scope of the invention be limited to the specific embodiments illustrated and described.

What is claimed is:

1. An light-emitting diode (LED) device comprising:
  a first LED module comprising:
    a substrate comprising a mounting surface;
    a first two row composite two-dimensional array comprising:
      a first two-dimensional array comprising two rows of a first plurality of LEDs on the mounting surface of the substrate, the first plurality of LEDs all having a same first orientation, and
      a second two-dimensional array adjacent the first two-dimensional array and comprising two rows of a second plurality of LEDs on the mounting surface of the substrate, the second plurality of LEDs all having a same second orientation;
    a plurality of first electrical traces on the mounting surface sequentially electrically coupling the first plurality of LEDs and the second plurality of LEDs to form a first LED string and a second LED string by beginning at opposite corners of the first two-row composite two-dimensional array and alternating between the two rows of each of the first and second two-dimensional arrays, each of the first and second LED strings having a beginning and an end;
    a second electrical trace on the mounting surface electrically coupled between the end of the first LED string and the end of the second LED string across the two rows of the two-row composite two-dimensional array; and
    a plurality of third electrical traces on the mounting surface and routing outside of the first two row composite two-dimensional array, a first one of the plurality of third electrical traces being electrically coupled to the beginning of the first LED string for the row of the first two row composite two-dimensional array containing the beginning of the first LED string, a second one of the plurality of third electrical traces being electrically coupled to the beginning of the second LED string for the other row of the two row composite two-dimensional array, a third one of the plurality of third electrical traces being electrically coupled to the end of the first LED string for the other row of the two row composite two-dimensional array, and at least one fourth one of the plurality of third electrical traces being electrically coupled to at least some of the further electrodes of the LEDs in the other row.

2. The device according to claim 1, wherein the plurality of third electrical traces route outside of the two row composite two-dimensional array all further electrodes of the LEDs in the other row.

3. The device according to claim 1, further comprising:
  a second LED module mounted on the substrate, the second LED module being identical to the first LED module but with the orientation, relative placement, and electrical connectivity of second LEDs of the second LED module being a mirror image of the orientation, relative placement, and electrical connectivity of the first LEDs of the first LED module about a line outside of the two row composite two-dimensional array of the second LED module, wherein the line is one of a vertical line neighboring the beginning of the second LED string and a horizontal line neighboring the beginning of the first LED string.

4. The LED module according to claim 3, further comprising:
a third LED module mounted on the substrate with the orientation, relative placement, and electrical connectivity of second LEDs of the second LED module being a mirror image of the orientation, relative placement, and electrical connectivity of the LEDs of the second LED module about the other one of the horizontal or vertical line than the line from which the LED module according to claim 3 was obtained.

5. The LED module according to claim 1, further comprising:
switches on the mounting surface with each of the switches being electrically coupled in parallel to a respective one of the LEDs via respective two traces of the third electrical traces.

6. The LED module according to claim 5, further comprising a controller on the mounting surface and communicatively coupled to control ports of the switches via fourth electrical traces.

7. The LED module according to claim 6, further comprising:
a connector on the mounting surface and electrically coupled, by respective ones of the third electrical traces, to the beginnings and ends of the first and second LED strings, and by one or more fifth electrical traces to the controller.

8. The LED module according to claim 1, wherein the first and second LED strings comprise 3 to 30 LEDs each.

9. The LED module according to claim 1, wherein neighboring LEDs in the two row composite two-dimensional array having a distance below 100 µm.

10. The LED module according to claim 1, wherein the substrate further comprises one of a heatsink made of AlN with a metallization layer on the mounting surface to form the electrical traces, an IMS, and a PCB.

11. The LED module according to claim 1, wherein the LEDs being mounted on the substrate in WLP technology.

12. The LED module according to claim 1, further comprising an optical component for receiving light emitted in operation from the LEDs.

13. A vehicle headlight comprising:
a fixture; and
an LED module comprising:
a substrate comprising a mounting surface,
a two row composite two-dimensional array comprising:
a first two-dimensional array comprising two rows of a first plurality of LEDs on the mounting surface of the substrate, the first plurality of LEDs all having a same first orientation,
a second two-dimensional array adjacent the first two-dimensional array and comprising two rows of a second plurality of LEDs on the mounting surface of the substrate, the second plurality of LEDs all having a same second orientation, and
a plurality of first electrical traces on the mounting surface sequentially electrically coupling the first plurality of LEDs and the second plurality of LEDs to form a first LED string and a second LED string by beginning at opposite corners of the two-row composite two-dimensional array and alternating between the two rows of each of the first and second two-dimensional arrays, each of the first and second LED strings having a beginning and an end,
a second electrical trace on the mounting surface electrically coupled between the end of the first LED string and the end of the second LED string across the two rows of the two-row composite two-dimensional array; and
a plurality of third electrical traces on the mounting surface and routing outside of the two row composite two-dimensional array, a first one of the plurality of third electrical traces being electrically coupled to the beginning of the first LED string for the row of the first two row composite two-dimensional array containing the beginning of the first LED string, a second one of the plurality of third electrical traces being electrically coupled to the beginning of the second LED string for the other row of the two row composite two-dimensional array, a third one of the plurality of third electrical traces being electrically coupled to the end of the first LED string for the other row of the two row composite two-dimensional array, and at least one fourth one of the plurality of third electrical traces being electrically coupled to at least some of the further electrodes of the LEDs in the other row.

14. The vehicle headlight according to claim 13, wherein the plurality of third electrical traces route outside of the two row composite two-dimensional array all further electrodes of the LEDs in the other row.

15. The vehicle headlight according to claim 13, further comprising:
switches on the mounting surface with each of the switches being electrically coupled in parallel to a respective one of the LEDs via respective two traces of the third electrical traces.

16. The vehicle headlight according to claim 15, further comprising a controller on the mounting surface and communicatively coupled to control ports of the switches via fourth electrical traces.

17. The vehicle headlight according to claim 16, further comprising:
a connector on the mounting surface and electrically coupled, by respective ones of the third electrical traces, to the beginnings and ends of the first and second LED strings, and by one or more fifth electrical traces to the controller.

18. The vehicle headlight according to claim 1, wherein neighboring LEDs in the two row composite two-dimensional array having a distance below 100 µm.

19. The vehicle headlight according to claim 1, wherein the first and second LED strings comprise 3 to 30 LEDs each.

20. A method of manufacturing an LED module, the method comprising:
forming a two row composite two-dimensional array on a mounting surface of a substrate by:
forming a first two-dimensional array on the mounting surface comprising two rows of a first plurality of LEDs on the mounting surface of the substrate, the first plurality of LEDs all having a same first orientation, and forming a second two-dimensional array adjacent the first two-dimensional array comprising two rows of a second plurality of LEDs on the mounting surface of the substrate, the second plurality of LEDs all having a same second orientation;

forming a plurality of first electrical traces on the mounting surface in locations such that the plurality of first electrical traces sequentially electrically couple the first plurality of LEDs and the second plurality of LEDs to form a first LED string and a second LED string by beginning at opposite corners of the first two-row composite two-dimensional array and alternating between the two rows of each of the first and second two-dimensional arrays, each of the first and second LED strings having a beginning and an end;

forming a second electrical trace on the mounting surface in a location such that the second electrical trace is electrically coupled between the end of the first LED string and the end of the second LED string across the two rows of the two-row composite two-dimensional array; and forming a plurality of third electrical traces on the mounting surface and routing outside of the first two row composite two-dimensional array such that: a first one of the plurality of third electrical traces is electrically coupled to the beginning of the first LED string for the row of the first two row composite two-dimensional array containing the beginning of the first LED string, a second one of the plurality of third electrical traces is electrically coupled to the beginning of the second LED string for the other row of the two row composite two-dimensional array, a third one of the plurality of third electrical traces is electrically coupled to the end of the first LED string for the other row of the two row composite two-dimensional array, and at least one fourth one of the plurality of third electrical traces is electrically coupled to at least some of the further electrodes of the LEDs in the other row.

\* \* \* \* \*